(12) United States Patent
Ryan et al.

(10) Patent No.: US 8,138,067 B2
(45) Date of Patent: Mar. 20, 2012

(54) METHOD AND SYSTEM FOR THE SYNTHESIS OF SEMICONDUCTOR NANOWIRES

(75) Inventors: Kevin M. Ryan, Co. Limerick (IE); Christopher Barrett, Limerick (IE)

(73) Assignee: University of Limerick, Limerick (IE)

( * ) Notice: Subject to any disclaimer, the term of this patent is extended or adjusted under 35 U.S.C. 154(b) by 165 days.

(21) Appl. No.: 12/813,729

(22) Filed: Jun. 11, 2010

(65) Prior Publication Data

US 2010/0317176 A1 Dec. 16, 2010

(30) Foreign Application Priority Data

Jun. 12, 2009 (EP) .................................. 09162561

(51) Int. Cl.
H01L 21/20 (2006.01)
H01L 21/36 (2006.01)

(52) U.S. Cl. ...................... 438/478; 423/447.3; 977/762; 977/775

(58) Field of Classification Search .................. 438/478; 423/447.3; 977/762, 775

See application file for complete search history.

(56) References Cited

U.S. PATENT DOCUMENTS

| | | | |
|---|---|---|---|
| 7,335,259 B2 * | 2/2008 | Hanrath et al. .................. | 117/87 |
| 7,858,181 B2 * | 12/2010 | Hanrath et al. ................ | 428/364 |
| 2003/0082927 A1 * | 5/2003 | Zhuang et al. ................. | 438/785 |
| 2004/0101467 A1 * | 5/2004 | Harutyunyan et al. .... | 423/447.3 |
| 2006/0251568 A1 * | 11/2006 | Fahlman ..................... | 423/447.3 |

OTHER PUBLICATIONS

Chockla et al., J Mater Chem, 19:996-1001 (2009). "Seeded germanium nanowire synthesis in solution."
Feng et al., Solid State Sciences, 10(10):1327-1332 (2008). "Synthesis of short palladium nanoparticle chains and their application in catalysts."
Fitzpatrick et al., Thin Solid Films, 517(13):3686-3694 (2009). "Oxidation resistance of thin boron carbo-nitride films on Ge(100) and Ge nanowires."
Gerion et al., Nano Letters, 4(4):597-602 (2004). "Solution synthesis of germanium nanocrystals: success and open challenges."
Gerung et al., J. Am. Chem. Soc, 128:5244-5250 (2006). "Solution synthesis of germanium nanowires using a Ge2+ alkoxide precursor."
Kim et al., Nano Letters, 9(2):864-869 (2009). "Catalyst-free growth of single-crystal silicon and germanium nanowires."
Zaitseva et al., Applied Physics Letters, 86:1-3 (2005). "Unseeded growth of germanium nanowires by vapor-liquid-solid mechanism."
Zaitseva et al., Chem. Mater. 19(21):5174-5178 (2007). "Germanium nanocrystals synthesized in high-boiling-point organic solvents."

* cited by examiner

*Primary Examiner* — Bradley K Smith
*Assistant Examiner* — Errol Fernandes
(74) *Attorney, Agent, or Firm* — Nixon Peabody LLP

(57) ABSTRACT

The invention provides a system and method for producing semiconductor nanowires, for example germanium or Silicon, grown by solution decomposition comprising the steps of heating at least one high boiling point solvent to its reaction temperature in a chamber and injecting a precursor directly into the chamber to react with the at least one high boiling solvent to produce a refluxing solvent. Subsequent vapour deposition of a monomer, achieved by the refluxing solvent, onto a locally heated substrate contained within the chamber produces the semiconductor nanowires. The system and method removes the dependency upon the incorporation of metal catalyst for the production of silicon and germanium nanowire, thereby nullifying the adverse effects of metal contamination in the resulting semiconductor nanowires.

13 Claims, 8 Drawing Sheets

METHOD AND SYSTEM FOR THE SYNTHESIS OF SEMICONDUCTOR NANOWIRES

CROSS REFERENCE TO RELATED APPLICATIONS

The present application claims the benefit of priority of European Application No. 09162561.6, filed Jun. 12, 2009, the contents of which are incorporated herein by reference.

FIELD OF THE INVENTION

The invention relates to the synthesis/production of semiconductor nanowires. In particular the invention relates to the unseeded Solution Synthesis of Silicon and Germanium Nanowires.

BACKGROUND TO THE INVENTION

The advancements in one-dimensional semiconductor nanostructures, are attracting significant attention with respect to their potential applications in nanoelectronic and photonic devices. This is due in part to the ever increasing problem of electromigration and subthreshold leakage in the miniaturization of electronic components for modern information industries.

Nanowires offer thermodynamically stable features and are typically defect-free and single-crystalline and thus have a number of advantages over thin films with respect to high-performance one-dimensional arrays of transistors. As some of the most important semiconducting materials, Si and Ge nanowires have also attracted a wide interest due to their unique size dependent electronic and optical properties and have been successfully implemented in high capacity power cells, field effect transistors and third generation solar cells.

The more complex, core-shell nanowires of Ge/SiOx have drawn considerable interest due to the higher intrinsic carrier mobilities of Ge, making it the more suitable material for a carrier channel and using Si as the shell material, which simplifies the chemical passivation of the structure, with SiOx being a much more stable and higher quality surface passivation than Ge oxides. Si and Ge nanowires have been prepared by employing a variety of known different techniques, such as laser ablation, physical thermal evaporation, chemical vapour deposition, and the more popular, vapour-liquid-solid (VLS). To date the simplest way to produce silicon or germanium nanowires has been with the VLS mechanism of growth. Many experimental variations have been used to achieve this including CVD, laser abalation and physical thermal evaporation, all of which require the need of metal catalyst.

The widely used VLS growth mechanism provides direct control of nanowire diameter and length and can be applied to a variety of materials including single and compound semiconductors from the group IV, III-V, and II-VI systems. Variations of VLS have been developed to realize anisotropic growth in solution (SLS) and in supercritical fluids (SFLS). In particular, the supercritical fluid-liquid-solid variation has been demonstrated as a tuneable approach to synthesising large yields of high quality nanowires.

Supercritical fluids are unique in that they can diffuse through solids like a gas while dissolving materials like a liquid and have been successfully used as fluid mediums for monomer diffusion in mesoporous templates. The application of these methods in realizing one-dimensional (1D) nanostructures is considered to be highly promising for scalable, economical, and controllable growth of a variety of elemental and compound 1D nanocrystals.

The following publications relate to the non-seeded synthesis of silicon and germanium nanowires.

(1) Kim, B.-S.; Koo, T.-W.; Lee, J.-H.; Kim, D. S.; Jung, Y. C.; Hwang, S. W.; Choi, B. L.; Lee, E. K.; Kim, J. M.; Whang, D. Nano Lett. 2009, 9 (2), 864-869.

(2) Gerion, D.; Zaitseva, N.; Saw, C.; Casula, M. F.; Fakra, S.; Van Buuren, T.; Galli, G. Nano Lett. 2004, 4 (4), 597-602.

(3) Gerung, H.; Boyle, T. J.; Tribby, L. J.; Bunge, S. D.; Brinker, C. J.; Han, S. M. J. Am. German Chem. Soc. 2006, 128 (15), 5244-5250.

(4) Zaitseva, N.; Dai, Z. R.; Grant, C. D.; Harper, J.; Saw, C. Chem. Mater. 2007, 19 (21), 5174-5178.

(5) Zaitseva, N.; Harper, J.; Gerion, D.; Saw, C. Appl. Phys. Lett. 2005, 86 (5), 1-3.

These publications attempt to provide a method for the production of pure single crystal Ge nanowires using a non-seeded synthetic route. A problem with the production of pure single crystal Ge nanowires is that the process is technically difficult to achieve.

Si and Ge nanowires synthesis has received intense investigation, given their high compatibility with standard CMOS technology and their expected ease of integration in future electronic devices. To realize group IV nanowire based electronic devices, it is important to gain precise control of their length, diameter, purity and structural quality. Of these, one of the most crucial problems has been nanowire purity due to the contamination occurred through the use of metal seed catalysts in the VLS technique.

The VLS growth mechanism utilizes a metal catalyst seed particle to form a eutectic alloy droplet with the desired semiconductor material. Saturation of the alloy droplet with additional monomer leads to the extrusion of a one dimensional semiconductor nanowire at reduced temperatures afforded by the eutectic alloy. The metal catalyst incorporation is needed given the high stability of Si and Ge compounds and the extremely elevated temperatures required to nucleat group IV crystalline material. In general, Si and Ge nanowires are most commonly grown using the VLS or SFLS processes by employing heavy metals such as Au, Bi, Co, Cu, Ni, and Fe as catalysts.

Gold (Au) is the most widely used catalyst for silicon nanowire growth because of its simple eutectic-type phase diagram and low eutectic temperature (360° C.). However, Au is also known to diffuse very rapidly into silicon and makes deep centers that increase p-n junction leakage and decrease dielectric strength, which is problematic. It has been noted that the metal from the catalyst particle wets the nanowire sidewalls, causing a tapering of the nanowire diameter and eventually consuming the droplet and terminating VLS growth. As a result the nanowires being developed from seeded synthetic routes are not pure enough to warrant electronic device incorporation.

To date, Saw are one of four groups internationally, who have reported the non-seeded synthesis of Ge nanowires, however none of these groups have managed to achieve sufficiently high yields or monodispersity of the nanowire dimensions from their systems.

An object of the invention is to provide a process and apparatus to provide non-metal seeded pure Ge and/or Si semiconductor nanowires to overcome the above mentioned problems.

SUMMARY OF THE INVENTION

According to the invention there is provided, as set out in the appended claims, a method for producing semiconductor nanowires grown by solution decomposition comprising the steps of:

heating at least one high boiling point solvent to its reaction temperature in a chamber; injecting a precursor, for example an organo-metallic precursor, directly into the chamber to react with the at least one high boiling solvent to produce a refluxing solvent; and subsequent vapour deposition of a monomer, achieved by the refluxing solvent, onto a locally heated substrate contained within the chamber to produce said semiconductor nanowires.

The method, according to the invention, removes the dependency upon the incorporation of metal catalyst for the production of silicon and germanium nanowires, thereby nullifying the adverse effects of metal contamination in the resulting semiconductor nanowires. Essentially the wire is grown without any seed using the method of the invention.

The invention also provides a synthetic route to the synthesis of non-metal seeded Ge, Si, SnO and ZnO nanowires using a solution precursor decomposition technique for the chemical vapour deposition (CVD) of monomer.

In the case of the present invention no metal catalyst, be it thin film or nanoparticle, is used which is the distinct difference with the method of the present invention. It has been shown that the smaller the nanoparticle catalyst used, the smaller the diameter of the resulting nanowire. However in the case of the invention the surface roughness of the substrate from which the nanowire is grown, dictates the diameter size of the nanowire produced. In this way, the diameter of a resulting nanowire can be controlled by the surface roughness of the substrate. Hence, a substrates' surface roughness may be tailored to grow a specific diameter of nanowire or varies sized nanowires at different locations across the substrate.

The invention allows the direct injection of precursors into the system which introduces a fast burst of monomer affording instantaneous formation of nanowires.

The invention allows the formation of nanowires at relatively low temperatures, affording a significant reduction in organic contamination within the resulting yield.

The simplicity of the procedural steps and the design of the invention allows for multiple reactions to be exactly replicated affording the reproducible production of high yields and quality nanowires.

The invention also provides a custom designed apparatus affords the fast production of pure single crystal Si and Ge nanowires with a tight diameter size distribution of 6-12 nm and in high yields of 200 mg per synthesis.

In one embodiment the invention provides the step of providing a constant flow of inert argon gas coupled to said chamber to control the production of said nanowires.

In one embodiment the invention provides the step of providing a water condenser attached to the top of said chamber. Cool water flowing through the condenser restricts the reflux of the reaction to the flask. Any reflux or gas expelled from the flask is condensed to a liquid which flows back into the reaction vessel.

In one embodiment the invention provides the step of controlling the heating of the chamber at different points in the chamber to control the temperature of each reaction. The control step comprises a 3-zone heating furnace to regulate the temperature of the chamber.

In one embodiment the invention the reaction temperatures of said at least one high boiling solvent can be between 380 and 500° C.

In one embodiment the invention the chamber comprises a lower bottom flask portion at one end and an elongated narrow channel portion at the other end.

In one embodiment the invention provides the step of producing said semiconductor nanowires in said channel portion.

In one embodiment of the invention said precursor can be one or more of the following: diphenylgermane, diphenylsilane, diphenylzinc, triphenyltin hydride, phenylgermane, trichlorogermane, tetraethylgermane, phenylsilane, tetramethylgermane, trigermane or trisilane.

In one embodiment of the invention said high boiling point solvents can be one or more of the following: squalene, squalane, olelylalchol, olelylamine and/or dotriacontaine.

In one embodiment the invention provides the further step of vapour depositing said semiconductor layers onto indium tin oxide coated glass along with a conductive polymer.

In one embodiment the invention provides the step of heating the substrate at a much higher temperature than the refluxing solvent, such that germane gas generated by said refluxing comes into contact with the heated substrate to decompose into germanium nanowires.

In one embodiment the invention provides germanium vapour deposition onto the substrate of said chamber nucleates the growth of the germanium nanowires.

In a further embodiment of the present invention there is provided a system for producing semiconductor nanowires, grown by solution decomposition, comprising:

means for heating at least one high boiling point solvent to its reaction temperature in a chamber;

means for injecting a precursor directly into the chamber to react with the at least one high boiling solvent to produce a refluxing solvent; and means for subsequent vapour deposition of a monomer, achieved by the refluxing solvent, onto a locally heated substrate contained within the chamber to produce said semiconductor nanowires.

In one embodiment the chamber comprises a lower bottom flask portion at one end and an elongated narrow channel portion at the other end.

In one embodiment there is provided means for producing said semiconductor nanowires on a surface of said channel portion.

In one embodiment there is provided means for controlling the heating of the chamber at different points in the chamber to control the temperature of each reaction.

There is also provided a computer program comprising program instructions for causing a computer program to carry out the above method which may be embodied on a record medium, carrier signal or read-only memory.

BRIEF DESCRIPTION OF THE DRAWINGS

The invention will be more clearly understood from the following description of an embodiment thereof, given by way of example only, with reference to the accompanying drawings, in which.

DETAILED DESCRIPTION OF THE DRAWINGS

Figure 1:
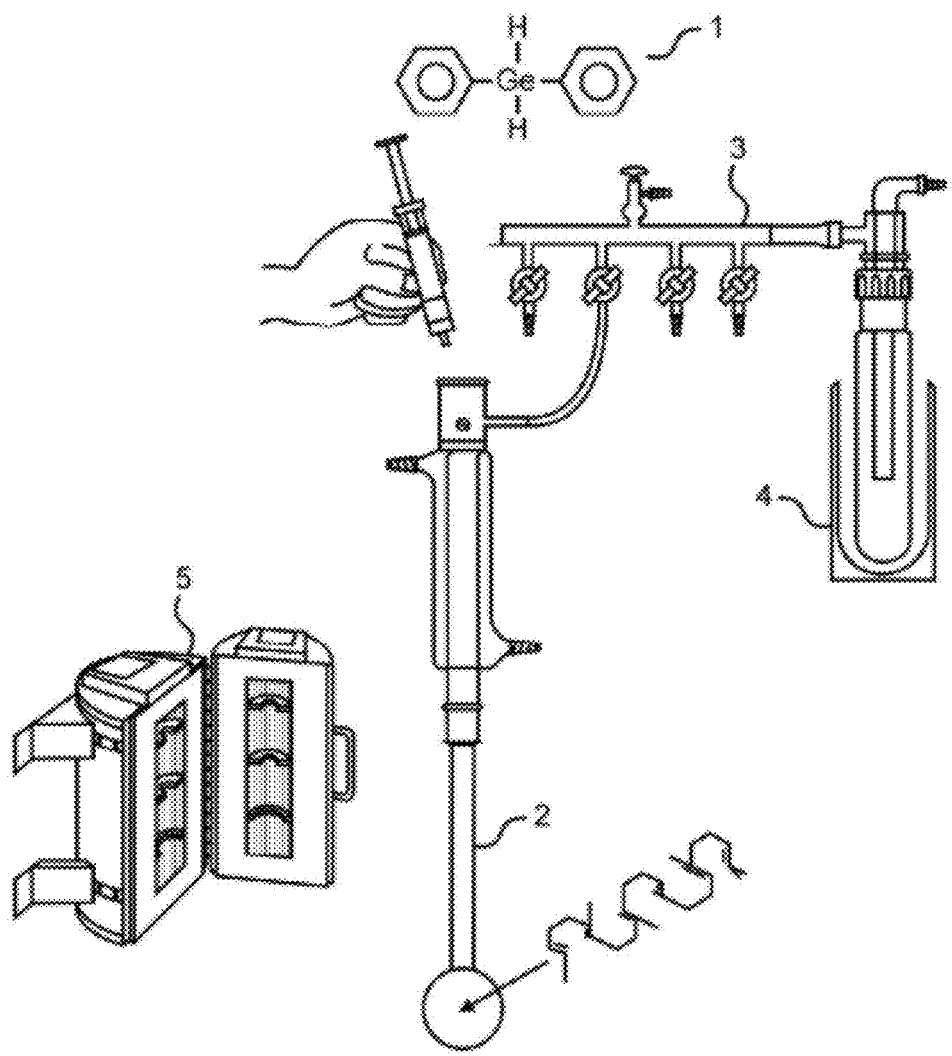
FIG. 1 illustrates a system to produce semiconductor nanowires, according to one aspect of the invention.

Referring now to the drawings, and initially FIG. 1, there is illustrated a system/apparatus to carry out the method of producing semiconductor nanowires, grown by solution decomposition, according to the invention indicated generally by the reference numeral 1. A high boiling point solvent is delivered into the bottom of a chamber 2. In a preferred embodiment the chamber 2 is a flask with a long neck. The high boiling point solvent is heated to its reaction temperature in the chamber 2 by a heating apparatus 5. A precursor is injected directly into the chamber 2 to react with at least one high boiling solvent to produce a refluxing solvent. Direct injection of a precursor into the system attributes the fast monomer supply needed to drive nanowire growth while the inert atmosphere of argon and the attached water condenser, 3, 4 contains the reaction. Subsequent chemical vapour deposition of a monomer, achieved by the refluxing solvent, onto a locally heated substrate contained within the chamber 2, produces the semiconductor nanowires.

Figure 2:
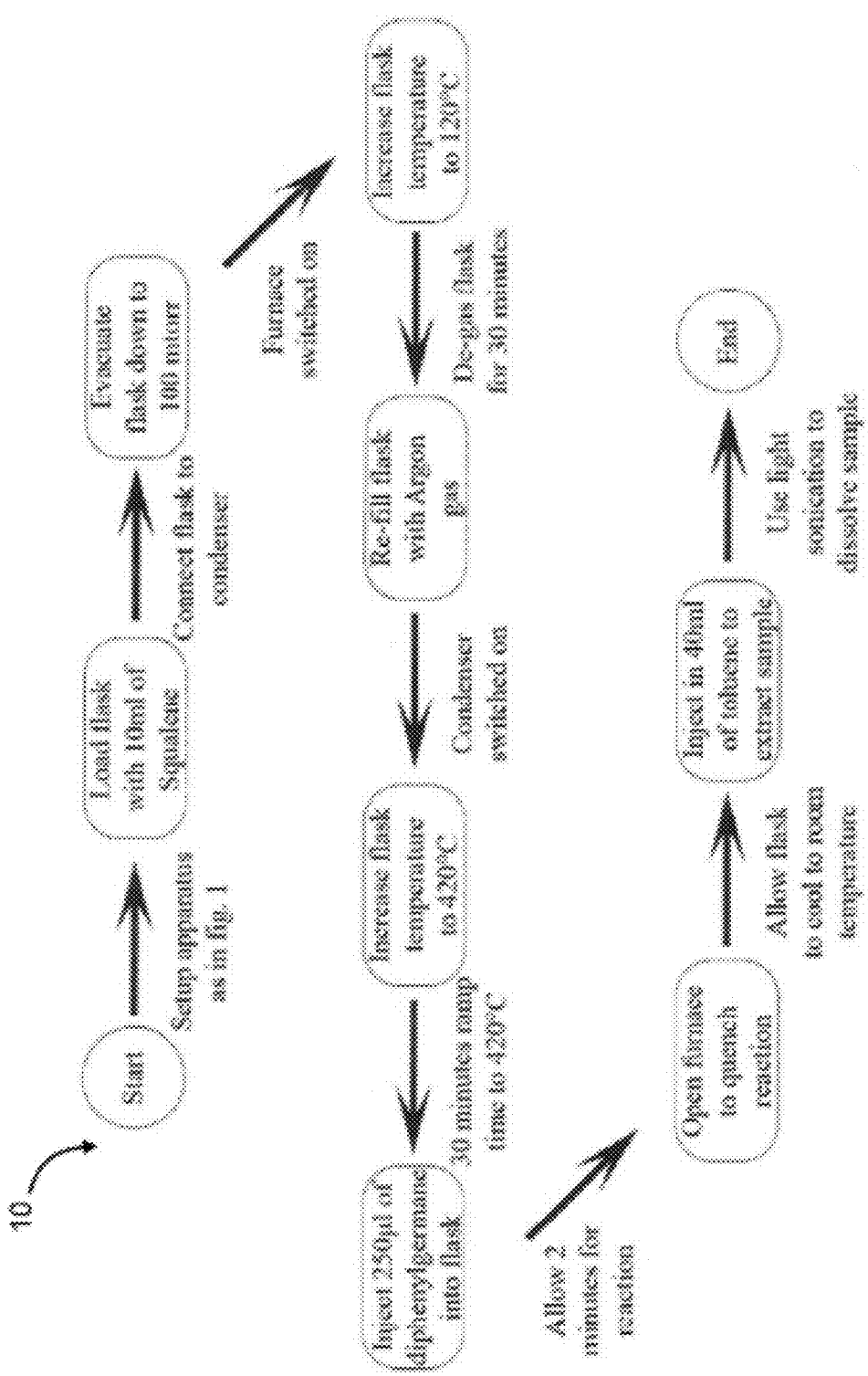
FIG. 2 is a flow chart illustrating operation of the invention according to one aspect of the invention.

The flowchart shown in FIG. 2, indicated by the reference numeral 10, outlines the step by step procedure for one preferred embodiment of Ge nanowire synthesis, according to the invention. The high boiling point solvent, in this case squalene, first undergoes a de-gas step to remove any impurities from the solvent. The reaction is subsequently brought to approximately 420° C. at which point the precursor, for example organo-metallic in composition, is injected. Upon completion, the crystalline yield is exact by light sonication in toluene.

Figure 3:
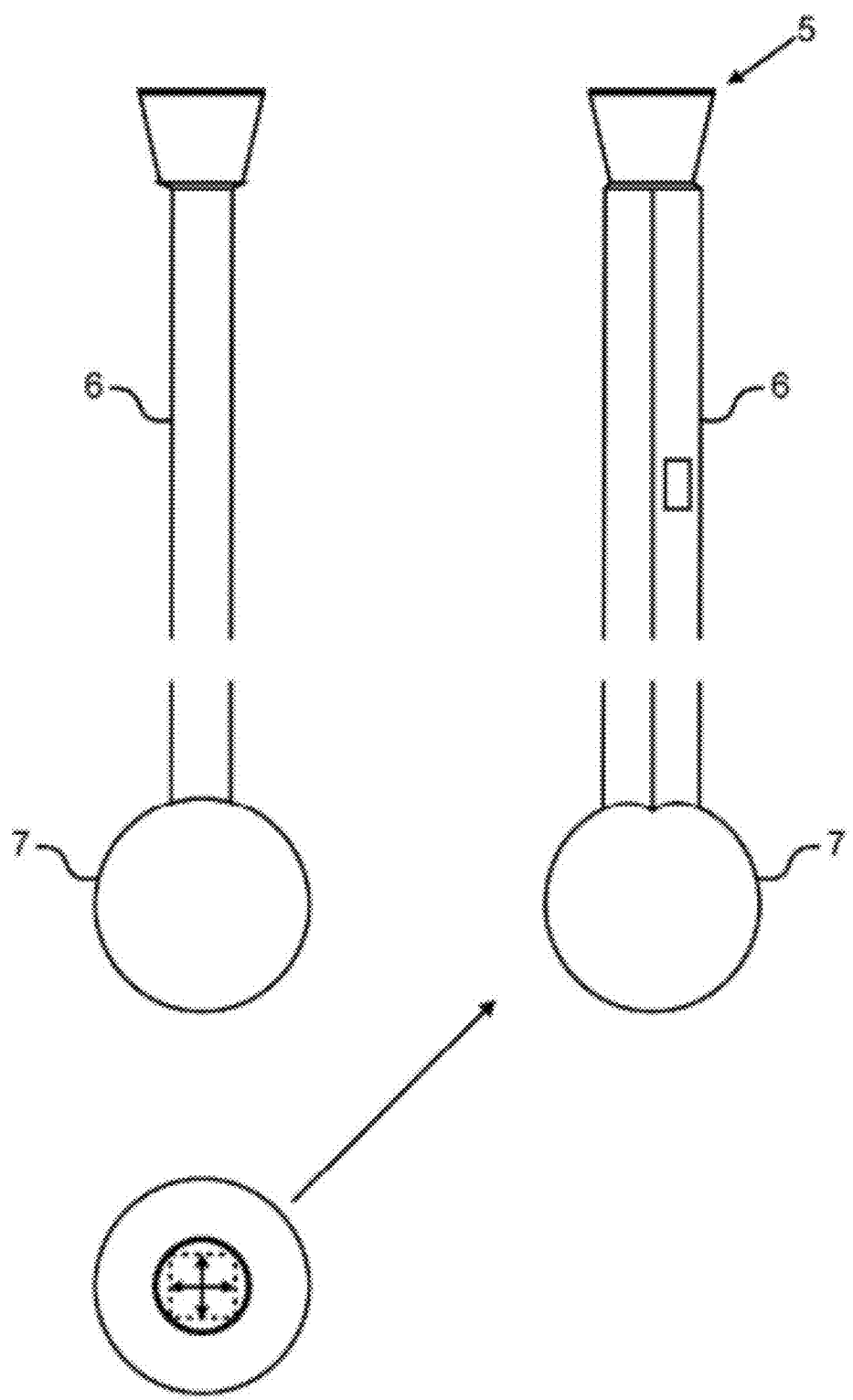
FIG. 3 illustrates a chamber for producing the semiconductor naonwires, according to the invention.

FIG. 3 illustrates a preferred set-up for the process that utilises an Applied Test Systems Inc. Model 3210, 3-zone heating furnace (shown by reference numeral 5 in FIG. 1) to regulate the temperature of the chamber. The chamber 2 can be a customised quartz round bottomed flask 7 with a long elongated neck 6. The flasks can be produced with dimensions of: Overall Height 350 mm, Globe Diameter 60 mm, Neck Length 290 mm, Neck Diameter 19 mm, Joint Size 19/22. The quartz reaction flask 2 of the chamber are made to withstand the high temperatures of synthesis while offering an inert enclosure, ruling out any unintentional contamination seen with metal reaction vessels. It will be appreciated that the term 'chamber' should be afforded a broad interpretation in the context of the present invention and can be of any dimension or size to facilitate the method of producing semiconductor nanowires, according to the invention.

Referring now to the invention in more detail, to reach the high temperatures needed to nucleat nanowire growth, several high boiling point solvents can be used (for example squalene, squalane, olelylalchol, olelylamine and dotriacontaine). These can be heated within the quartz round bottomed flask, encased in the 3-zoned furnace 5, to reaction temperatures of between 380 and 500° C. The system can be kept under control using the standard techniques of a constant flow of inert argon gas through the system, coupled with a water condenser attached to the round bottomed flask.

To achieve the fast monomer saturation needed for nanowire growth, as opposed to nanoparticle growth, a rapid introduction of precursor is used by directly injecting into the system using a syringe. The round bottomed flask (chamber) used has a much longer neck than is usual, which upon injection of precursor contains only a small volume (10-20 ml) of high boiling point solvent.

The precursor, for example diphenylgermane, initially breaks down into germane gas in the high boiling point solvent. Some other precursors that can be used, but not limited to, include: diphenylgermane, diphenylsilane, diphenylzinc, triphenyltin hydride, phenylgermane, trichlorogermane, tetraethylgermane, phenylsilane, tetramethylgermane, trigermane or trisilane.

Given the refluxing nature of the solvent at this stage, the germane gas is readily expelled up the neck of the flask. The neck side walls are at a much higher temperature than the refluxing, high boiling point solvent and once the germane gas comes in contact with these walls it further decomposes into germanium. The germanium chemical vapour deposition onto the sidewalls of the flask nucleates the growth of germanium nanowires.

Figure 4:
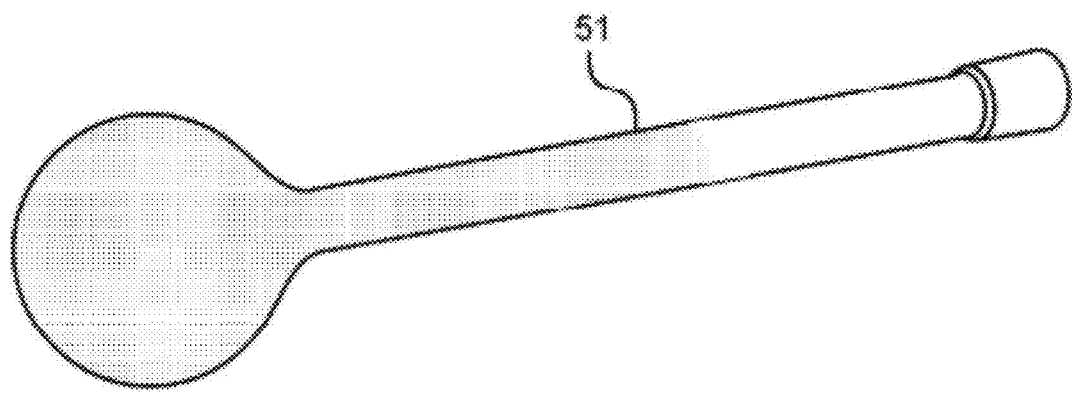
FIG. 4 illustrates, upon completion of the process, the semiconductor nanowires adhering to the walls of the chamber.

FIG. 4 shows, upon completion of the reaction, the semiconductor nanowires adhering to the flask walls is a visible purple colour (indicated by shading 51 in FIG. 4) and can be removed by light sonication in the presence of toluene. The toluene dissolves the nanowires to give a strong pink to purple colour which is indicative of Ge nanowire diameters below the Bohr excitation radius of 24 nm.

Figure 5:
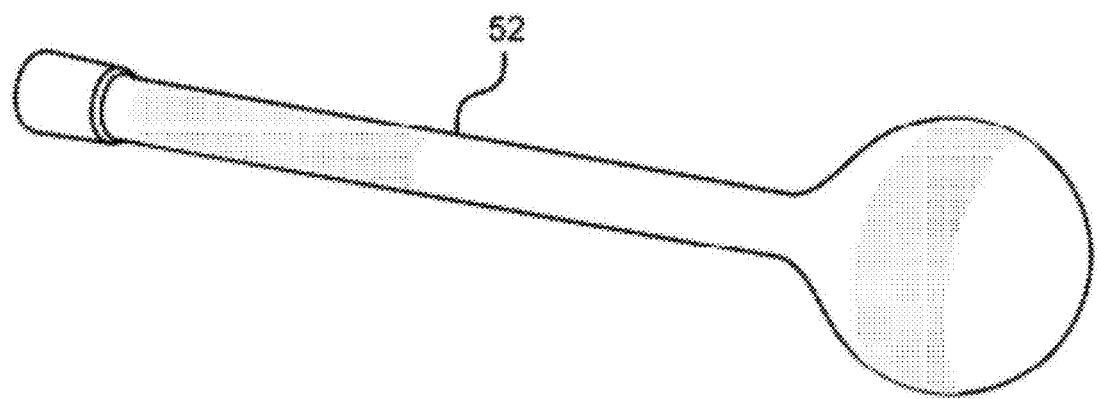
FIG. 5 illustrates the 3-zone furnace used in the heating of the reaction chamber that can control the temperature during operation.

FIG. 5 illustrates how the 3-zone furnace used in the heating of the reaction chamber that can precisely control the temperature of each reaction affording control and exact repeatability with each new synthesis. Also, given the CVD nature of the nanowire growth, localised heating of certain zones can be used to direct growth to a desired location in the chamber 52. FIG. 5 shows how the nanowires can be grown in certain zones in the chamber 51 where the shading shows the nanowire growth.

In a further embodiment of the invention wherein Si or Ge nanowires have been vapour deposited onto silicon or metallic substrates, with the subsequent deposition of a conductive graphite layer. This can be used for the production of a new, more efficient anode component of Li-ion batteries, given the large surface area of the nanowires.

Figure 6:
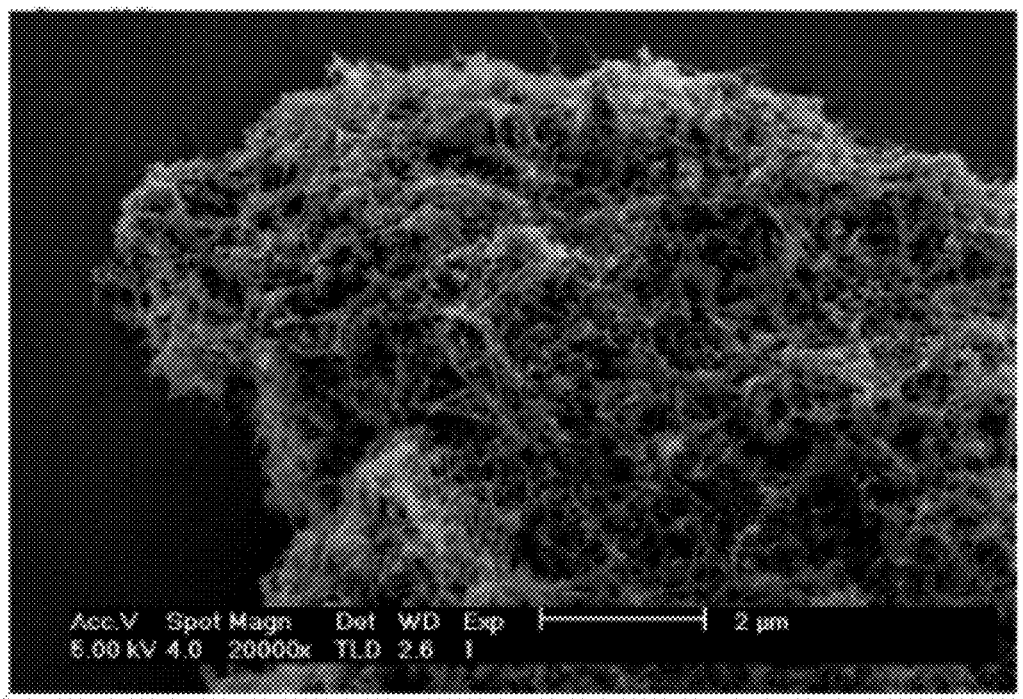
FIG. 6 is an SEM image showing high yields of 200 mg of nanocrystalline product produced according to the invention.
Figure 7:
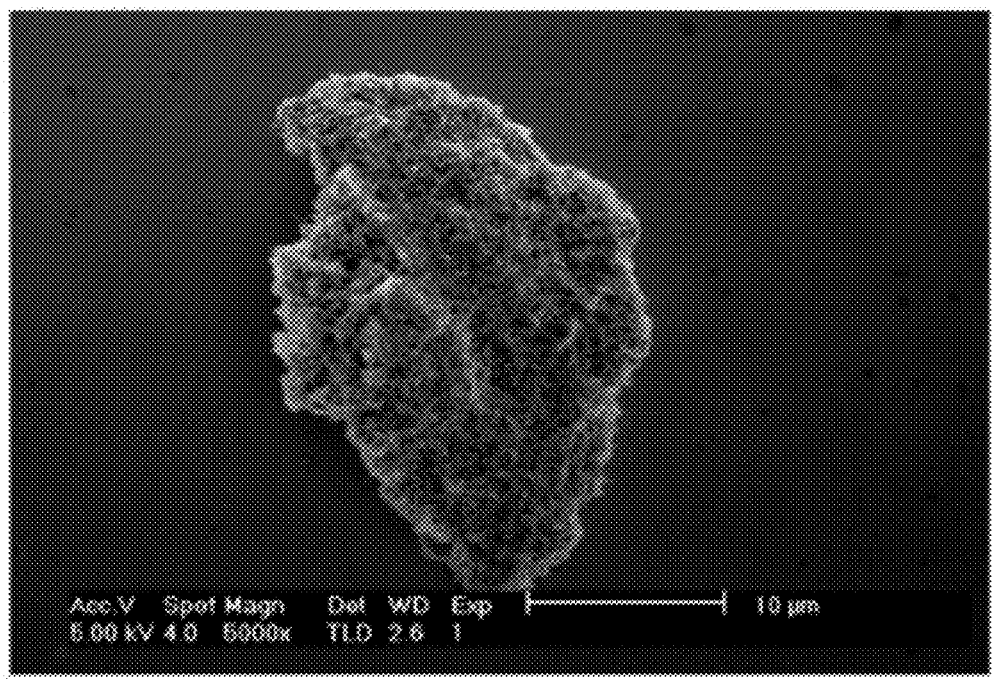
FIG. 7 is another SEM image showing high yields of 200 mg of nanocrystalline product produced according to the invention.

The method of the present invention can achieve a 75% conversion rate of precursor, allowing high yields of 200 mg of nanocrystalline product, as shown by SEM images in FIG. 6 and FIG. 7, to be readily and easily reproduced with each synthesis. The method offers the flexibility of using a range of high boiling point solvents, which can be recycled upon completion of a synthesis for re-use in subsequent reactions.

By altering the organo-metallic precursor injected, the apparatus can be tailored to the production of other semiconductor materials, for example Gallium arsenide, silicon, indium phosphide, cadium sulfide and zinc selenide) and can also be used for the production of more complex, core-shell heterostructures such as $Ge/SiO_x$.

Figure 8:
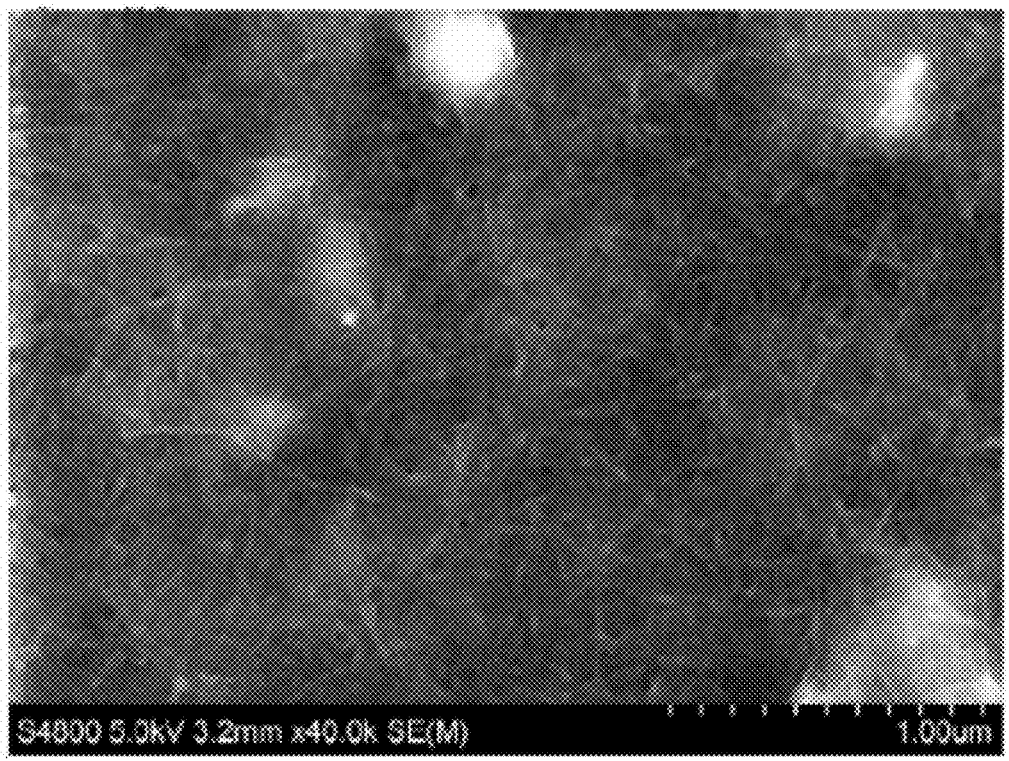
FIG. 8 illustrates a SEM image of a further embodiment of the invention wherein Ge nanowires have been electrophoretically deposited onto indium tin oxide.
Figure 9:
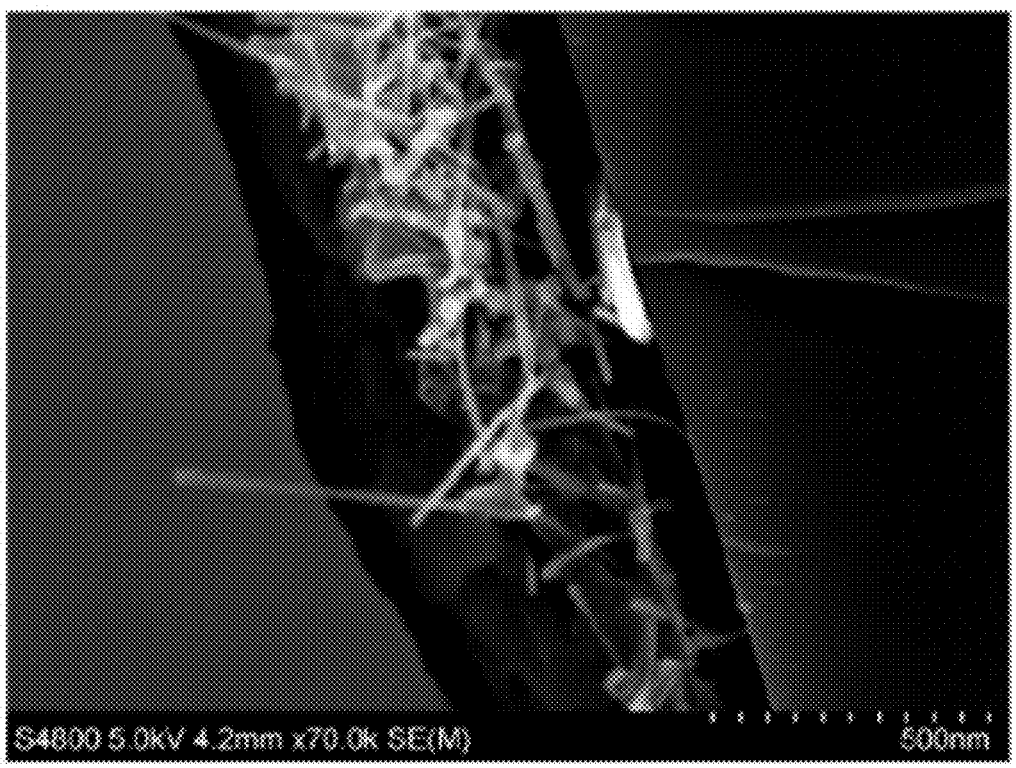
FIG. 9 illustrates a magnified SEM image of FIG. 8.

In a further embodiment of the invention wherein Si or Ge nanowires have been vapour deposited onto indium tin oxide coated glass, with the subsequent deposition of a conductive polymer, P3HT. By further deposition a thin film of Aluminium which would act as a top contact, with the layer of indium tin oxide as the back contact, a simple solar cell can be constructed. This can be used for the production of a new, more efficient type of solar cell, given the large surface area of the nanowires. The results obtained are illustrates by SEM images FIGS. 8 and 9.

Figure 10:
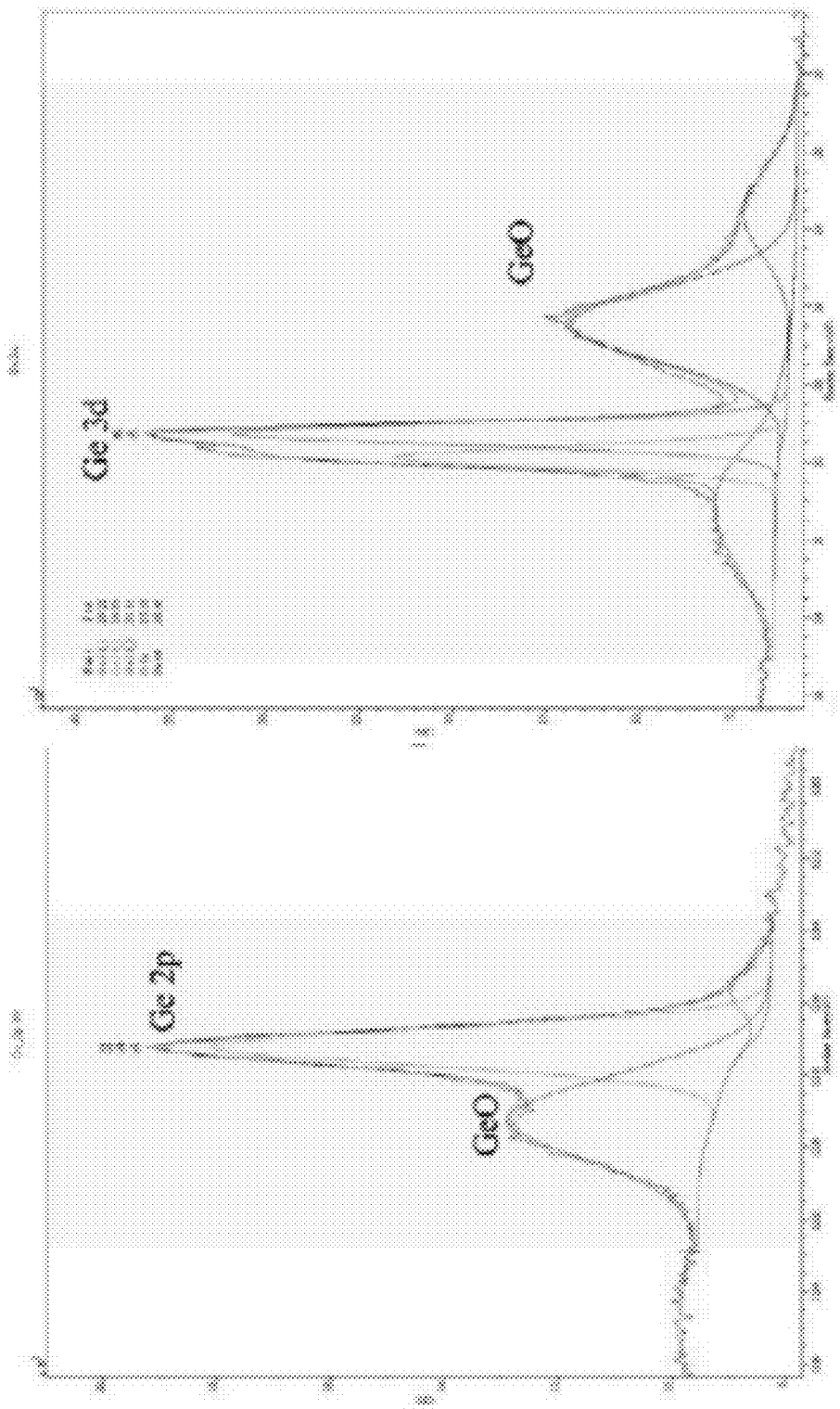
FIG. 10 illustrates the characteristics of the nanowires produced by the quantitative spectroscopic technique of X-ray photoelectron spectroscope.

FIG. 10 demonstrates the characteristics of the nanowires produced according to the present invention by the quantitative spectroscopic technique of X-ray photoelectron spectroscope, which clearly demonstrates the purity of the nanowires.

It will be appreciated that high yields of mono-dispersed, unseeded germanium nanowires have many applications, for example:

1: Engineering materials on the nanoscale by combining controlled nanomaterial synthesis and organised assembly methods offers the potential to create new electronic devices with improved performance and functionality. Unseeded Si or Ge nanowires grown using this technique could be of particular interest as a model system for studying new physical phenomena arising from their scaled geometries as well as for applications in high performance field-effect transistors.

2: Research on nanowire-based solar cells is still in its infancy however a strong broadband optical absorption has been measured and discussed for nanowire fabrication on glass substrates by vapour deposition, which makes these nanowires a good candidate to serve as an absorber in third generation solar cells.

3: There has been much research interest in the development of higher-specific-energy lithium batteries, particularly in higher-capacity alternatives for the Li-graphite anode. Given this, Li-nanowire based power cells are being studied for the improved performance of attributed to good electronic conduction along the length of each nanowire, short Li insertion distances, high interfacial contact area with electrolyte, good electrical contact between each nanowire and the current collector and improved material durability due to nano structuring.

It will be appreciated in the context of the above description that Si and Ge nanowire production is described herein described with reference to the description and/or figures, the invention can also be applied to the production of all types of non-metal semiconductor nanowires, such as silicon.

The embodiments in the system and method described with reference to the drawings may comprise a computer apparatus and/or processes performed in a computer apparatus to control the operation of the system and method. However, the invention also extends to computer programs, particularly computer programs stored on or in a carrier adapted to bring the fraud prevention system of the invention into practice. The program may be in the form of source code, object code, or a code intermediate source and object code, such as in partially compiled form or in any other form suitable for use in the implementation of the method according to the invention. The carrier may comprise a storage medium such as ROM, e.g. CD ROM, or magnetic recording medium, e.g. a floppy disk or hard disk. The carrier may be an electrical or optical signal which may be transmitted via an electrical or an optical cable or by radio or other means.

While the invention has been described herein with reference to several especially preferred embodiments, these embodiments have been presented by way of example only, and not to limit the scope of the invention. Additional embodiments thereof will be obvious to those skilled in the art having the benefit of this detailed description, especially to meet specific requirements or conditions. Further modifications are also possible in alternative embodiments without departing from the inventive concept.

The invention is not limited to the embodiments herein before described but may be varied in both construction and detail.

The invention claimed is:

1. A method of producing semiconductor nanowires, grown by solution decomposition, comprising the steps of:
heating at least one high boiling point solvent to its reaction temperature in a chamber;
injecting a precursor directly into the chamber to react with the at least one high boiling solvent to produce a refluxing solvent; and
subsequent vapour depositing of a monomer, achieved by the refluxing solvent, onto a locally heated substrate contained within the chamber to produce said semiconductor nanowires.

2. The method of claim 1 comprising the step of providing a constant flow of inert argon gas coupled to said chamber to control the production of said nanowires.

3. The method of claim 1 comprising the step of providing a constant flow of inert argon gas coupled to said chamber to control the production of said nanowires and a water condenser attached to the top of said chamber.

4. The method of claim 1 comprising the step of controlling the heating of the chamber at different points in the chamber to control the temperature of each reaction.

5. The method of claim 1 comprising the step of controlling the heating of the chamber at different points in the chamber to control the temperature of each reaction, wherein said control step comprises a 3-zone heating furnace to regulate the temperature of the chamber.

6. The method of claim 1 wherein the reaction temperatures of said at least one high boiling solvent is between 380 and 500° C.

7. The method of claim 1 wherein the chamber comprises a lower bottom flask portion at one end and an elongated narrow channel portion at the other end.

8. The method of claim 1 wherein the chamber comprises a lower bottom flask portion at one end and an elongated narrow channel portion at the other end and comprising the step of producing said semiconductor nanowires on a surface of said channel portion.

9. The method of claim 1 wherein the precursor is diphenylgermane.

10. The method of claim 1 wherein said high boiling point solvents can be one or more of the following: squalane, olelylalchol, olelylamine and/or dotriacontaine.

11. The method of claim 1 comprising the further step of vapour depositing said semiconductor layers onto indium tin oxide coated glass along a conductive polymer.

12. The method of claim 1 comprising the step of heating the substrate at a much higher temperature than the refluxing solvent, such that germane gas generated by said refluxing contacts with the heated substrate to decompose into germanium nanowires.

13. The method of claim 12, wherein germanium chemical vapour deposition onto the substrate of said chamber nucleates the growth of the germanium nanowires.

* * * * *